US006986666B2

(12) United States Patent
Benson et al.

(10) Patent No.: US 6,986,666 B2
(45) Date of Patent: Jan. 17, 2006

(54) ELECTRONIC DEVICE ENCLOSURE WITH ROTATIONALLY LOCKED BODY AND HEADER

(75) Inventors: Robert Benson, Liverpool, NY (US); Henry Pixley, East Syracuse, NY (US); Souheil Zraik, Liverpool, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 0 days.

(21) Appl. No.: 10/764,845

(22) Filed: Jan. 26, 2004

(65) Prior Publication Data

US 2005/0164525 A1 Jul. 28, 2005

(51) Int. Cl.
*H01R 12/00* (2006.01)

(52) U.S. Cl. .......................... 439/63; 439/579; 174/93
(58) Field of Classification Search ................. 439/63, 439/277, 279, 583–585, 901–903, 579; 385/60; 174/93; 411/180, 182–183
See application file for complete search history.

(56) References Cited

U.S. PATENT DOCUMENTS

| 3,245,028 A | 4/1966 | Badger ....................... 439/289 |
| 3,641,253 A * | 2/1972 | Weagant ....................... 174/93 |
| 3,680,034 A | 7/1972 | Chow et al. ................. 439/289 |
| 3,742,425 A | 6/1973 | Peltola et al. .................. 439/63 |
| 3,846,738 A * | 11/1974 | Nepovim ..................... 439/584 |
| 4,125,308 A | 11/1978 | Schilling ...................... 439/63 |
| 4,258,977 A * | 3/1981 | Lukas et al. .................. 385/60 |
| 4,426,127 A | 1/1984 | Kubota ....................... 439/609 |
| 4,556,271 A | 12/1985 | Hubbard ...................... 439/277 |
| 4,820,185 A * | 4/1989 | Moulin ........................ 439/321 |
| 4,902,856 A * | 2/1990 | Miller .......................... 174/91 |
| 4,911,660 A | 3/1990 | Alf et al. ..................... 439/585 |
| 4,964,805 A | 10/1990 | Gabany ........................ 439/63 |
| 5,322,453 A | 6/1994 | Resnick et al. .............. 439/581 |
| 5,752,839 A | 5/1998 | Fiacco et al. ................. 439/63 |
| 5,772,470 A | 6/1998 | Togashi ....................... 439/582 |
| 5,807,117 A | 9/1998 | Kempf et al. ................. 439/63 |
| 5,842,873 A | 12/1998 | Gonzales ...................... 439/63 |
| 5,971,770 A | 10/1999 | Richmond .................... 439/63 |
| 6,019,622 A * | 2/2000 | Takahashi et al. ........... 439/188 |
| 6,217,384 B1 | 4/2001 | Strasser et al. ............. 439/583 |
| 6,296,492 B1 | 10/2001 | Fujimoto et al. ............. 439/63 |
| 6,491,546 B1 * | 12/2002 | Perry .......................... 439/620 |

* cited by examiner

*Primary Examiner*—Michael C. Zarroli
(74) *Attorney, Agent, or Firm*—Wall Marjama & Bilinski LLP

(57) ABSTRACT

An assembly for housing electronic components for use in a CATV system. The assembly includes a hollow body member having a central axis and opposite ends, at least one header adjoining one end of the body member in coaxial relation. The body member includes a notch in one end and the header includes a tab configured to extend into the notch to rotationally lock the body member to the header. The assembly may also include a plurality of hollow body members and a pair of headers each having a central axis. The body members and headers are positioned in an axially aligned array with the headers at opposite ends. The assembly includes cooperative structure rotationally locking each of the body members and headers to the adjacent body member and header. The assembly may further include a sleeve covering at least portions of the body member and headers.

32 Claims, 6 Drawing Sheets

ELECTRONIC DEVICE ENCLOSURE WITH ROTATIONALLY LOCKED BODY AND HEADER

BACKGROUND OF THE INVENTION

The present invention relates to enclosures for electronic devices, and more particularly to enclosures having one or more hollow, cylindrical body portions with a header on one or both ends used in cable television (CATV) applications.

Coaxial cable devices such as RF filters mounted upon circuit boards are commonly housed in cylindrical enclosures having so-called body and header portions. When the device is installed in the field, the installer typically used a wrench to connect and tighten the adjoining connector, thereby applying a torque to the header. This torque is often great enough to cause rotation of the header relative to the body, resulting in failure of the device. Prior attempts to address this problem have included providing flat (i.e., linear) sides on the otherwise circular header which mate with flat sides on the interior of one end of an outer sleeve surrounding both the body and header. Such arrangements, although they may rotationally lock the header and outer sleeve, do not ensure that the header and body will not rotate relative to one another.

Of course, it is necessary that the body and header of such devices be permanently assembled in a manner which prevents longitudinal separation of the parts. This feature is commonly provided in current designs by an inductive soldering operation having a number of drawbacks not the least of which is the requirement to purchase and maintain the inductive soldering equipment. This equipment is added to multiple pieces of automated assembly equipment to control all aspects of the soldering process which is extremely critical to function or failure of the device. The many uncontrollable variables make the soldering process very unstable, resulting in high maintenance cost as well as higher scrap rates. Some of these variables are induction coil diameter, coil spacing between the wrapped coils, power connection channels, temperature of product/process areas and cooling system efficiency. Furthermore, spare parts must be stocked for the soldering equipment, creating an additional expense, as does the power required to operate the equipment. Consequently, significant savings could be realized by elimination of the induction soldering operation.

The principal object of the present invention is to provide an electronic device for the CATV industry having novel and improved means for maintaining a cylindrical body in assembled relation with a header.

Another object is to provide an electronic device including a housing formed by a hollow cylindrical body with a header at one or both ends wherein torque may be applied to the device without relative rotation of the body and header.

A further object is to provide means for preventing relative rotation of header and body portions of an electronic device in response to torque applied to the device during installation in the field.

It is also an object of the invention to provide means for longitudinal locking of body and header portions of an electronic device without requiring any soldering operation.

Still another object is to provide a method of constructing and assembling hollow enclosures for coaxial cable devices which include a cylindrical body closed at one or both ends by a header wherein toque applied to the header does not result in relative rotation of the body and header.

Other objects will in part be obvious and will in part appear hereinafter.

SUMMARY OF THE INVENTION

In furtherance of the preceding objects, the invention contemplates an enclosure including a hollow, cylindrical body with one or more notches formed in (i.e., cut out of) the cylindrical wall at the end(s) to which a header is applied to provide an end closure. The header is provided with integral tabs extending axially from the periphery to mate with the notches in the body. Thus, when the header is placed on the end of the body, the tabs extend into the notches and effectively prevent relative rotation of the two parts. In a first embodiment, consisting of a single body with male and female headers at opposite ends, the headers and body are assembled with a slip fit and are thereafter enclosed and restrained from relative axial movement by a tightly fitting, outer sleeve which is formed over each end of the device. In the second disclosed embodiment, a 6-pole device having three body portions, a shield and a cap, in addition to a header at each end, longitudinally adjoining parts are assembled with an interference fit, being thereby maintained in longitudinally assembled relation.

Details of construction and operation of the invention will be more clearly understood and fully appreciated from the following detailed disclosure, taken in conjunction with the accompanying drawings.

DETAILED DESCRIPTION

Figure 1:
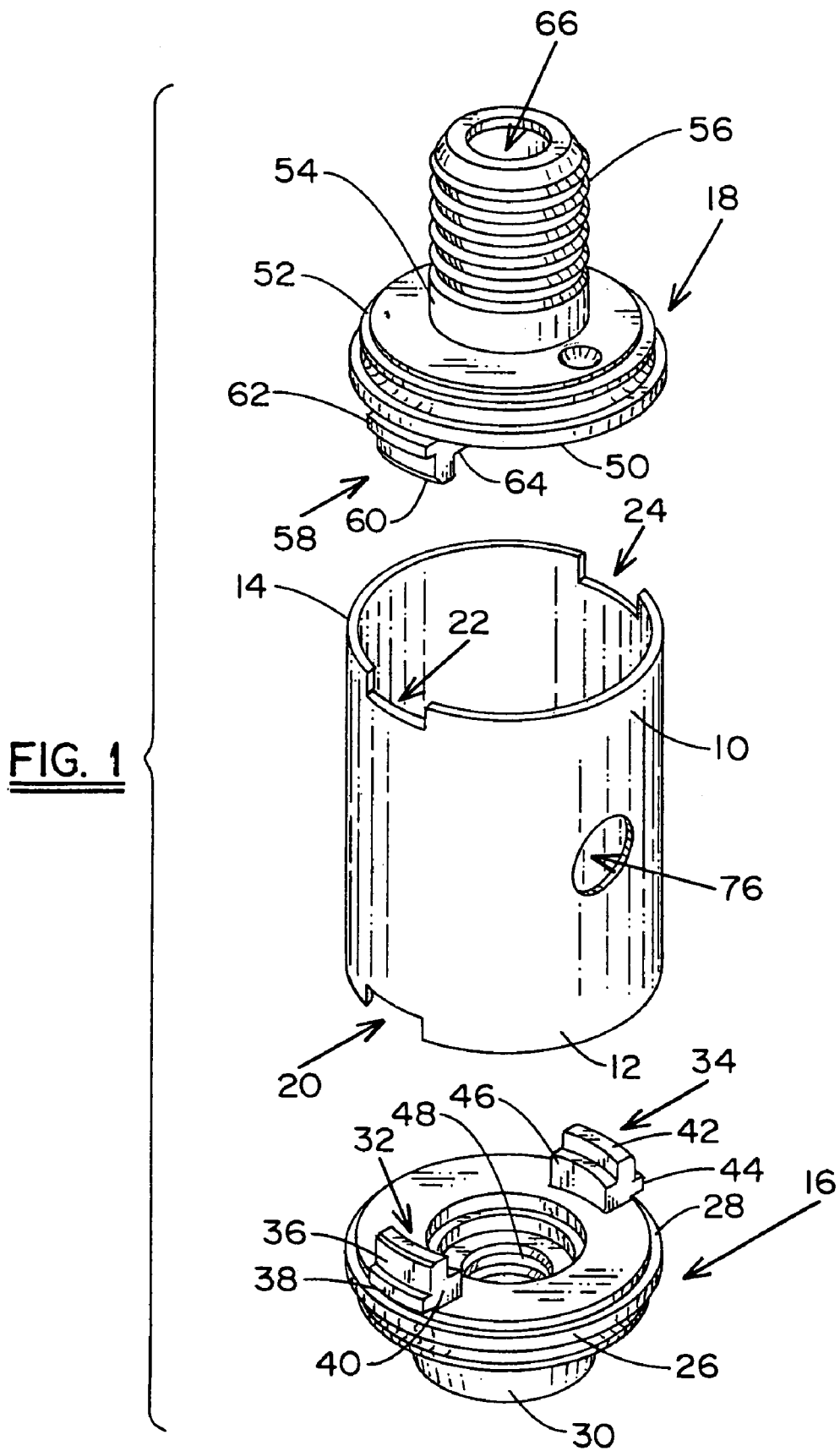
FIG. 1 is an exploded perspective view showing elements of a first embodiment of the invention.
Figure 2:
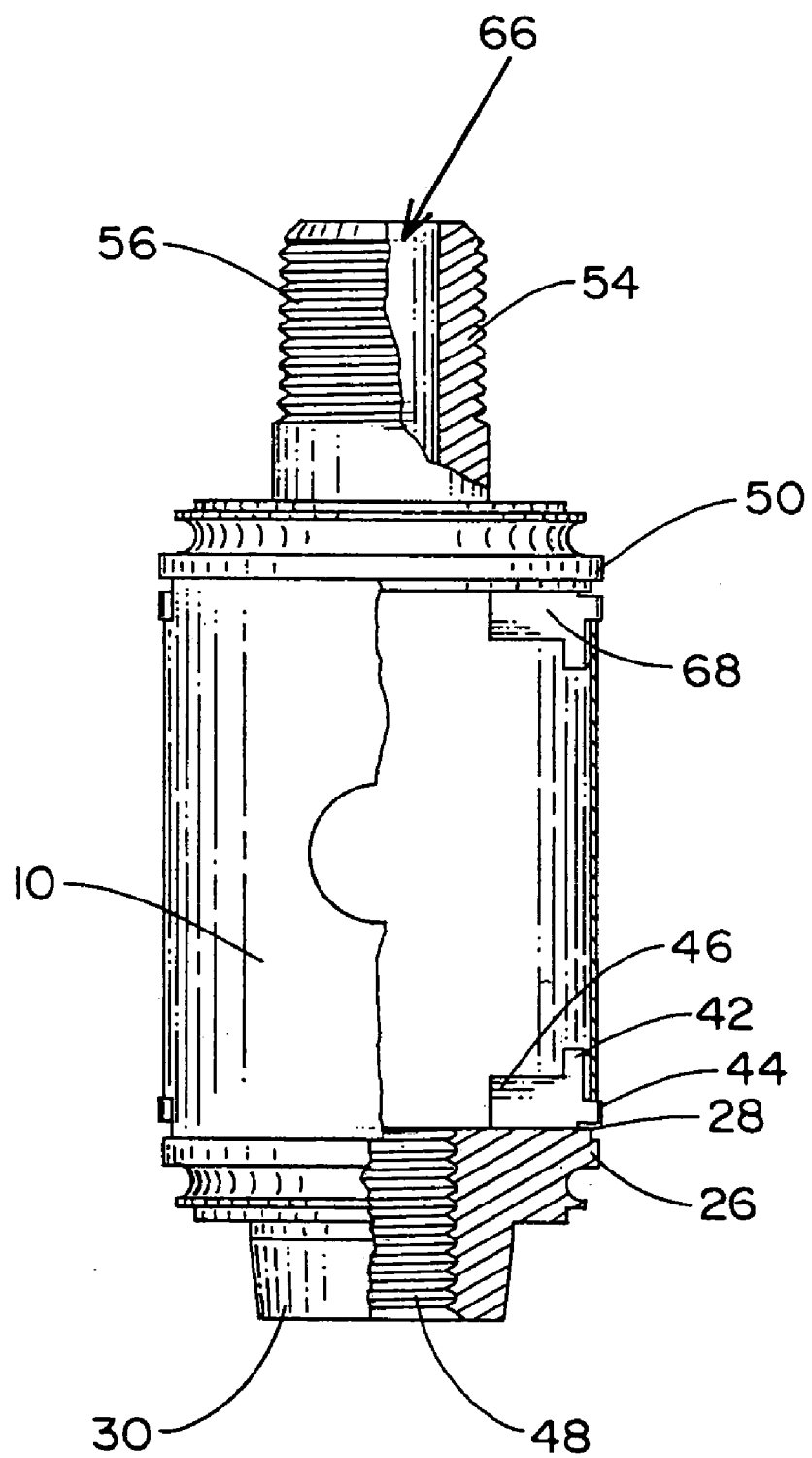
FIG. 2 is a front elevational view of the elements of FIG. 1 in assembled relation, with portions broken away.
Figure 3:
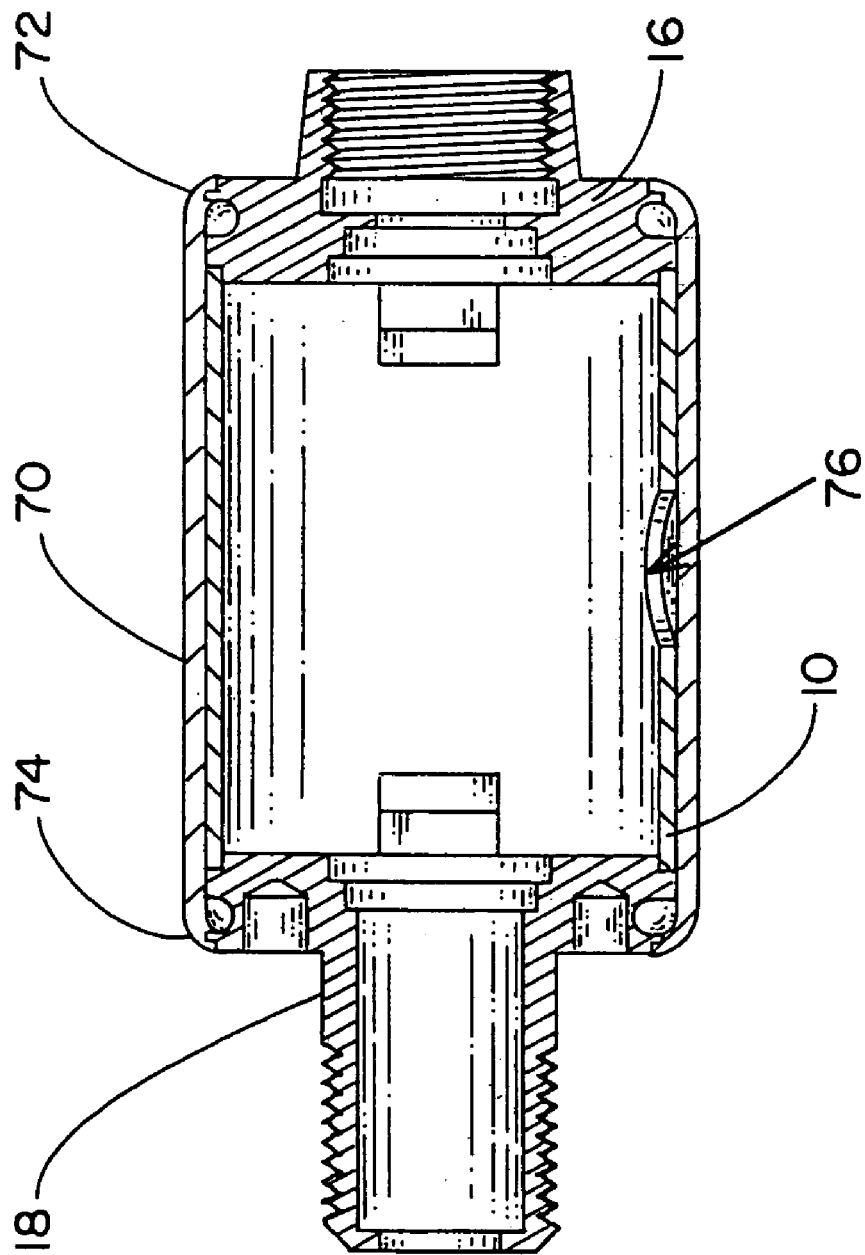
FIG. 3 is an elevational view of the device of FIGS. 1 and 2 in full section following assembly with an additional element.

Referring now to the drawings, in FIGS. 1–3 is shown a first embodiment of elements of an enclosure for an electronic device such as an RF trap for use in CATV applications. The elements shown in FIGS. 1 and 2 consist of a hollow, cylindrical body 10 having opposite ends 12 and 14 in parallel planes, male header 16 and female header 18. Notch 20 and a corresponding notch on the diametrically opposite side (not seen in FIG. 1) are cut into the wall of body 10 on opposite sides of end 12, and notches 22 and 24 are cut into the body wall on opposite sides of end 14.

Male header 16 includes central, annular portion 26 having a diameter substantially equal to the outer diameter of body 10, and annular portion 28 having a diameter substantially equal to the inner diameter of body 10. Stem portion 30 extends from one side of male header 16 and diametrically opposed tabs 32 and 34 extend from the other side, i.e., the said facing body 10. Tab 32 includes central portion 36, outer portion 38 and inner portion 40; likewise, tab 34 includes central, outer and inner portions 42, 44 and 46, respectively. A central opening, having internal threads 48, extends through male header 16.

Female header 18 includes annular portions 50 and 52, having diameters substantially equal to the outer and inner diameters, respectively, of body 10. Stem portion 54, having external threads 56, extends from one side of the header and a pair of diametrically opposite tabs, one of which is seen in FIG. 1 and denoted by reference numeral 58, extend from the other side. Tab 58 includes central, outer and inner portions 60, 62 and 64, respectively, i.e., the four tabs extending from the two headers are substantially identical. Central opening 66 extends through header 18.

The body and headers are shown in assembled relation in FIGS. 2 and 3. Tabs 32 and 34 of header 16 have been placed in slot 20 and the corresponding slot on the opposite side of end 12 of the body, respectively. Likewise, tab 58 and the corresponding tab on the diametrically opposite side of header 18, indicated in FIG. 2 by reference number 68, have been placed in slots 22 and 24, respectively. The diameter at the outer surfaces of outer tab portions 38 and 44 is substantially equal to the diameter of annular portion 26, i.e., to the outer diameter of body 10. The diameter at the outer faces of central tab portions 36 and 42 is substantially equal to the diameter of annular portion 28 and the inner diameter of the body. Thus, when the elements are placed in axially adjoining relation, the outer portion of each tab (e.g., portion 44) extends into and abuts the inner side of the corresponding notch, and the central portion of each tab (e.g., portion 42) extends into the body adjacent the inner wall of body 10. The circumferential extent (width) of each tab is about the same or slightly less than that of the notches, whereby the elements are rotationally locked when placed in axially adjoining relation. That is, the outer portions of the tabs extend through the corresponding notches and, having widths approximately equal to those of the notches, effectively prevent relative rotation of the body and headers as torque is applied to one of the elements by a wrench. Assembly is completed by axial insertion of the body and headers into a closely fitting sleeve 70 and forming opposite ends 72 and 74 of the sleeve over the outer peripheries of headers 16 and 18, respectively, thereby retaining the body and headers in axially assembled relation. Hole 76 is provided in a side wall of body 10 for insertion of a tool by an assembler to tweak and tune the circuit components (not shown) within the body to final specifications.

Figure 4:
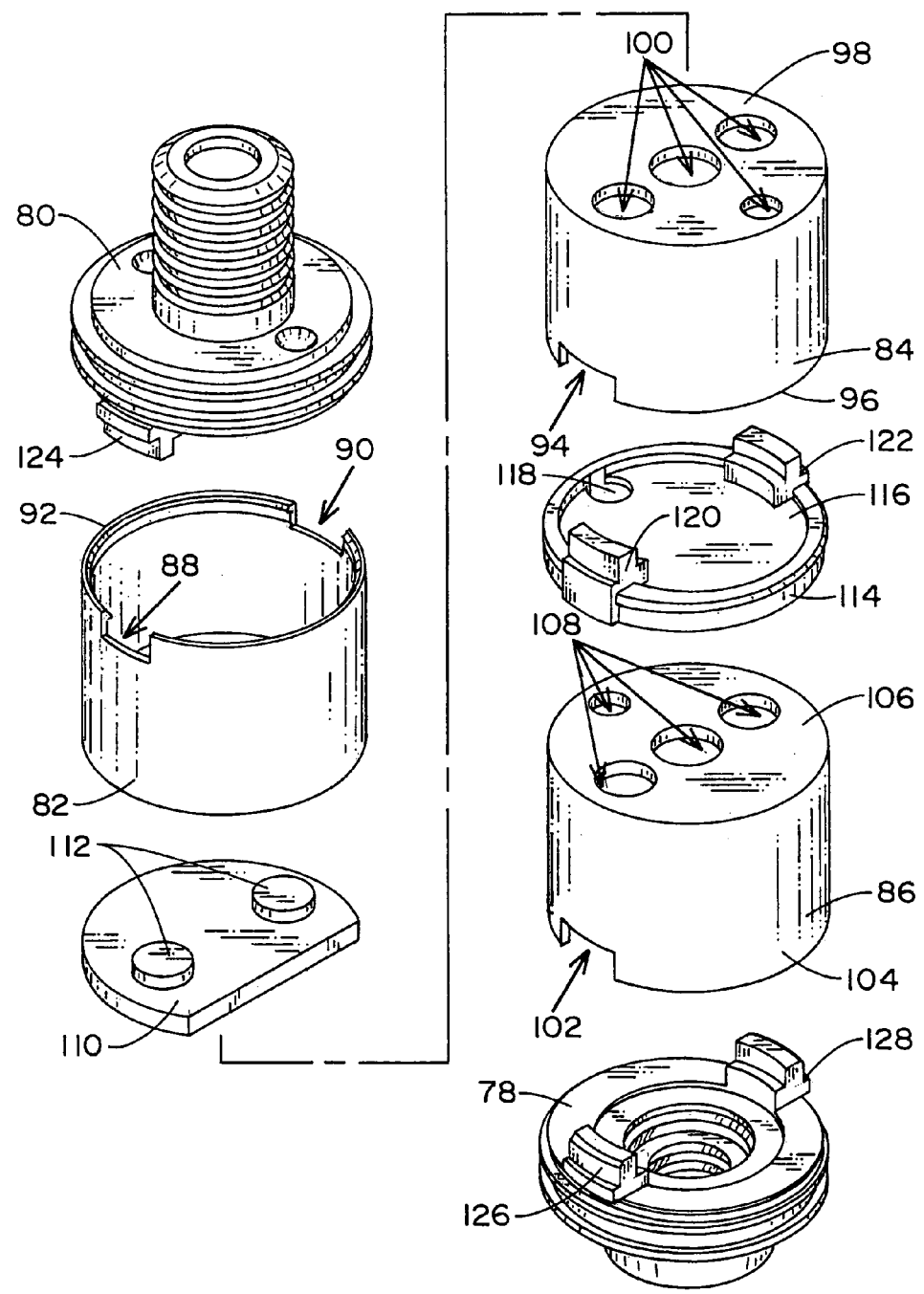
FIG. 4 is an exploded perspective view showing elements of a second embodiment of the invention.
Figures 5, 6:
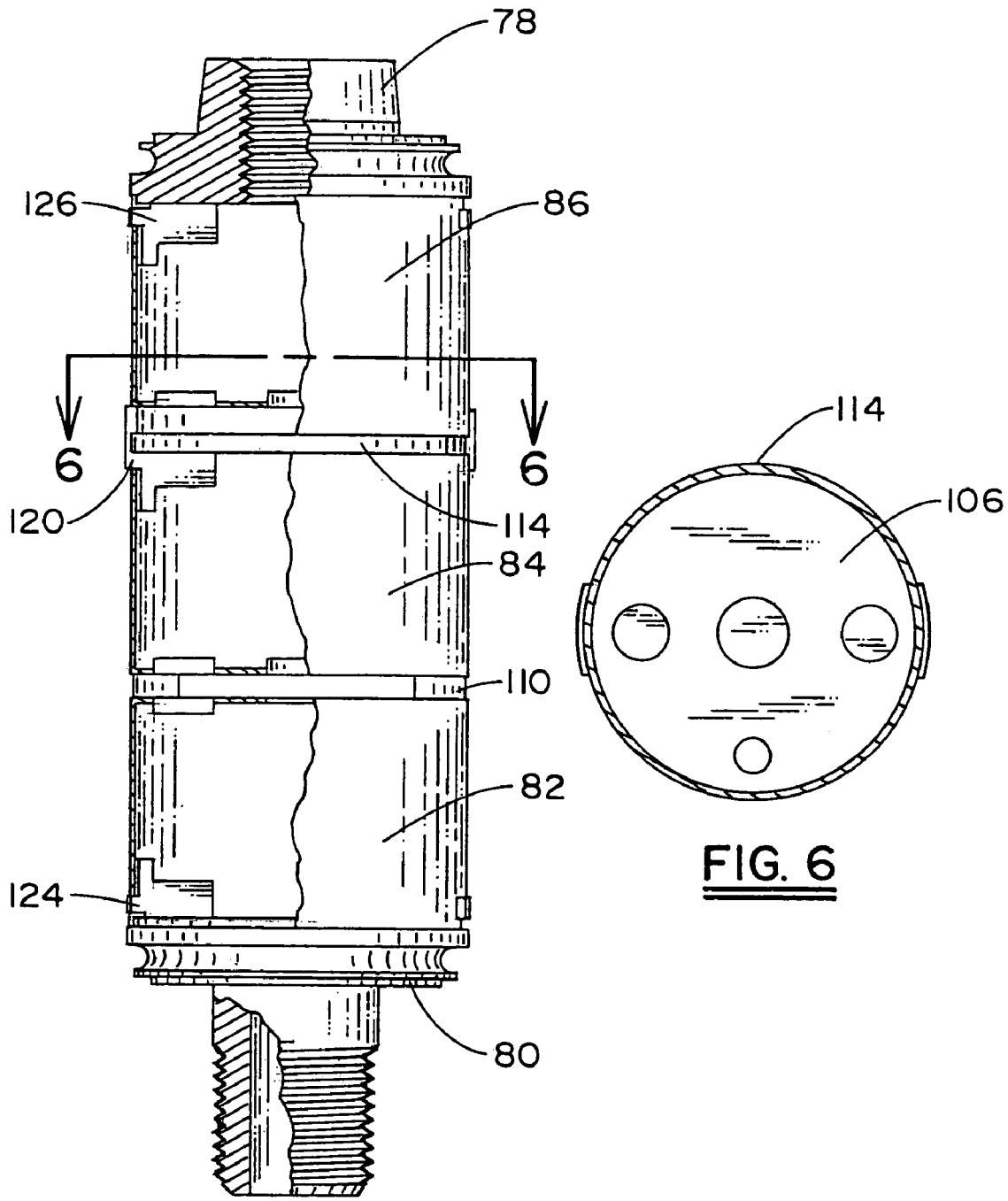
FIG. 5 is a front elevational view of the elements of FIG. 4 in assembled relation, with portions broken away.
FIG. 6 is a plan view in section on the line 6—6 of FIG. 5.
Figure 7:
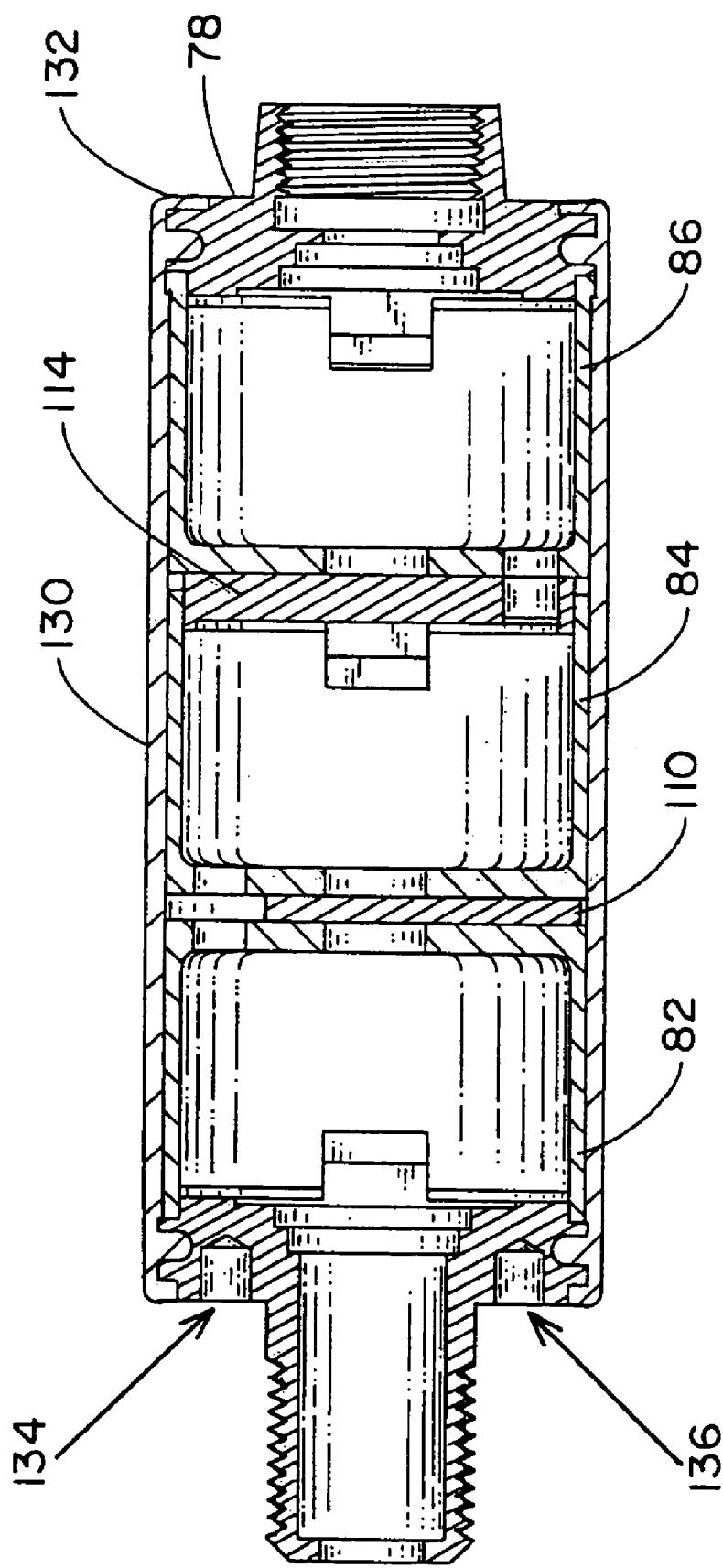
FIG. 7 is an elevational view of the device of FIGS. 4 and 5 in full section following assembly with an additional element.

Turning now to FIGS. 4–7, the invention is shown in a second embodiment. This is a six-pole device including male and female headers 78 and 80, which are identical to headers 16 and 18, respectively, of the previous embodiment. However, instead of one body member, open and notched at both ends, the present embodiment includes three body portions, termed first, second and third body portions and numbered 82, 84 and 86, respectively. First body portion 82 includes notches 88 and 90 extending into the body wall from end 92. Notch 94, and a diametrically opposite slot not seen in FIG. 4, extends into open end 96 of second body portion 84, the other end being closed by wall 98, having openings 100. Third body portion 86 includes notch 102, and a corresponding notch on the opposite side, extending into open end 104; wall 106, having openings 108, closes the other end of body portion 86. Opening 108 is used not only for inserting a tuning tool, but also for inserting potting (conformal) material which fixes the tuned components permanently in place. The end of first body portion 82 opposite end 92, not seen in FIG. 4, is also closed by a wall having openings corresponding to openings 100 and 108.

Locking shield 110 is interposed between first and second body portions 82 and 84, respectively, and includes protrusions 112 on one side for engagement in holes in the closed end of body portion 82 and corresponding protrusions (not shown) on the opposite side for engagement in the outer two of holes 100 in end wall 98 of second body portion 84. Locking ring 114, having end wall 116 with opening 118, is interposed between second and third body portions 84 and 86. Tabs 120 and 122 extend into slot 94 and the corresponding slot on the other side of end 94 of body portion 84 and protrusions (not shown) on the underside of wall 116 extend into the outer two of holes 108. Tab 124 on header 80 extends into notch 88 and the corresponding tab on the opposite side of header 80 extends into notch 990. Tabs 126 and 128 of header 78 extend into notch 102 and the corresponding notch on the opposite side of end 104 of third body portion 82. In the present embodiment, it is preferred that the tabs on the headers and locking ring engage the body portions with an interference fit. Openings 136 are provided in header 80 for engagement by a spanner wrench to tighten the device to an adjoining connector.

What is claimed is:

1. A filter assembly for use in a CATV system comprising:
   a) a hollow body member for housing a filter circuit said member having a central axis and opposite ends;
   b) a filter circuit housed within said body member;
   c) a header having a central axis and a threaded connector longitudinally adjoining one of said ends in coaxial relation; and
   d) a notch in one of said body member and header and a tab on the other of said body member and header, said tab extending into said notch to rotationally lock said body member and said header to one another.

2. The enclosure of claim 1 further comprising a pair of notches extending into said body member from said one end and a pair of tabs on said header extending into respective ones of said notches.

3. The enclosure of claim 1 further comprising a second header.

4. The device of claim 3 wherein said body member includes a pair of notches extending into each of said body member ends and said second header includes a pair of tabs extending into said notches.

5. A device for use in a CATV system comprising:
   a) a plurality of hollow body members each having a central axis and opposite ends in parallel planes;
   b) a pair of headers each having a central axis;
   c) said body members and headers being positioned in an axially aligned array with said headers at opposite ends of said array, and said structure rotationally locking each of said body members and headers to the adjacent body member and header.

6. The device of claim 5 wherein said structure comprises at least one notch extending into at least one of said ends of each of said body members and a corresponding tab on each of said headers extending into each of said notches.

7. The device of claim 1 and further including a sleeve covering at least portions of both said body and header to maintain said header and body in longitudinally adjoining relation.

8. The device of claim 1 wherein said header and body are joined with an interference fit maintaining said header and body in longitudinally adjoining relation.

9. A device for use in a CATV system comprising:
   a) a hollow, cylindrical body member having a central axis and opposite ends in parallel planes;

b) a male header having a first annular portion, a first stem portion, and a central axis surrounded by a through opening with internal threads;

c) a female header having a second annular portion, a second stem portion having external threads, and a central axis surrounded by a through opening;

d) said body member and headers being arranged in coaxial relation wit said mail and female headers respectively adjacent said opposite ends of said body member; and e) one of a notch and a tab in each of said body member ends and the other of a notch and a tab in each of said headers, each of said tabs extending into a corresponding notch to rotationally lock said body and said headers to one another.

10. The device of claim 9 wherein a pair of said notches extend into each of said body member ends, and each of said headers includes a pair of said tabs.

11. The device of claim 10 wherein each of said notches has a pair of substantially linear sides spaced by a first, peripheral distance and each of said tabs has a pair of sides spaced by a peripheral distance substantially equal to said first distance, whereby said tabs are restrained from lateral movement within said notches and said headers are restrained from rotation relative to said body member.

12. The device of claim 11 wherein said first and second stem portions extend from one side of said first and second annular portions, respectively, and said tabs extend from the other side.

13. The device of claim 12 wherein said notches are positioned diametrically opposite one another in each of said body member ends, and each of said tabs are positioned diametrically opposite one another on each of said headers.

14. A multi-pole device for use in a CATV system comprising:

a) first, second and third hollow, cylindrical body members of substantially equal inner and outer diameters, each having first and second ends in parallel planes, positioned in successive, coaxial relation with a first; open end of said first body member at one end and a second, open end of said third body member at the other end;

b) a first header including a first annular portion with a central axis surrounded y a first, through opening, and a first threaded portion;

c) a second header including a second annular portion with a central axis surrounded by a second, through opening, and a second threaded portion;

d) said first and second headers being positioned axially adjacent said first end of said first body member and said second end of said third body member, respectively; and e) first means rotationally locking said first header to said one end of said first body member, second means rotationally locking said first body member to said second body member, third means rotationally locking said second body member to said third body member, and fourth means rotationally locking said second end of said third body member to said second header.

15. The device of claim 14 wherein said first means comprises a notch in one and a tab on the other of said first body member and said first header, said tab extending into said notch to rotationally lock said first body member to said first header.

16. The device of claim 15 wherein a pair of notches extend into said first end said first body member and a pair of tabs extend from said first annular portion into said notches.

17. The device of claim 14 wherein said second means comprises a locking shield positioned between and rotationally locked to said second end of said first body member and said first end of said second body member.

18. The device of claim 17, wherein said second end of said first body member and said first end of said second body member are closed by respective end walls each having at least one opening, and said locking shield includes at least one protrusion extending into each of said openings.

19. The device of claim 14 wherein said third means comprises a locking ring positioned between and rotationally locked to said second end of said second body member and said first end of said third body member.

20. The device of claim 19 wherein said second end of said second body member is open, a pair of notches extend into said second end of said end of said second body member, said first end of said third body member is closed by an end wall having at least one opening, and said locking shield includes a pair of tabs extending from one side into said notches and a protrusion of the other side extending into said opening.

21. The device of claim 14 wherein said fourth means comprises a notch in one and a tab on the other of said third body member and said second header, said tab extending into said notch to rotationally lock said third body member to said second header.

22. The device of claim 21 wherein a pair of notches extend into said second end of said third body member and a pair of tabs extend from said second annular portion into said notches.

23. The device of claim 14 wherein longitudinally adjoining elements are retained in assembled relation by interference fit.

24. The method of fabricating and assembling a filter assembly for use in a CATV system comprising:

a) forming a hollow, cylindrical body member having a central axis, a body diameter and first and second ends in parallel planes;

b) forming a first header having an annular portion;

c) forming an axially extending notch at the first end of the body member substantially equal in diameter to the body diameter;

d) forming an axially extending tab on the annular portion of the first header substantially equal in diameter to the body diameter;

e) housing a filter circuit within said body member; and f) slip fitting the tab on the header into the notch in the end of the body member to rotationally lock the header to the body member.

25. The method of claim 24 including the additional steps of:

a) forming a second header having an annular portion and an axially extending tab on the annular portion of the second header substantially equal in diameter to the body diameter;

b) forming an axially extending notch at the second end of the body member substantially equal in diameter to the body diameter; and c) slip fitting the tab on the second header into the notch in the second end of the body member to rotationally lock the second header to the body member.

26. The method of claim 25 comprising the additional steps of
   a) forming at least a second hollow body member; and
   b) positioning said body members and headers in an axially aligned array with said headers at opposite ends of said array; and
   c) rotationally locking each of said body members and headers to the adjacent body member and header.

27. The method of claim 26 and further comprising enclosing said body member and at least portions of said first and second headers in a closely fitting, hollow sleeve and forming ends portions of said sleeve over the peripheries of said first and second annular portions, thereby maintaining said body member and said headers in axially adjacent relation.

28. A filter assembly for use in a CATV system comprising
   a) a hollow body member having a central axis, a body diameter and opposite ends in parallel planes, the body member having an axially extending notch at one end substantially equal in diameter to the body diameter;
   b) a filter circuit housed within said body member; and
   c) a header having a central axis longitudinally adjoining one of the ends in coaxial relation, the header having an axially extending tab substantially equal in diameter to the body diameter and configured to slip fit into the notch,
   whereby the header and body member become rotationally locked in a slip fit assembly.

29. The assembly of claim 28 wherein the body member is configured to house an electronic component.

30. The assembly of claim 28 wherein the header includes a threaded connector.

31. The assembly of claim 28 further comprising a second header.

32. The assembly of claim 31 wherein the each header includes a plurality of tabs and each end of the body member includes a plurality of notches.

* * * * *

UNITED STATES PATENT AND TRADEMARK OFFICE
CERTIFICATE OF CORRECTION

PATENT NO. : 6,986,666 B2 Page 1 of 1
APPLICATION NO. : 10/764845
DATED : January 17, 2006
INVENTOR(S) : Benson et al.

It is certified that error appears in the above-identified patent and that said Letters Patent is hereby corrected as shown below:

Column 4, Line 14. The number "990" is incorrect. Please replace with --90--.

Column 5, Line 9. The sentence "wit said mail and female headers" is incorrect. Please replace with --with said male and female headers--.

Column 5, Line 46. The letter "y" is incorrect. Please replace with --by--.

Signed and Sealed this

Fifth Day of June, 2007

JON W. DUDAS
*Director of the United States Patent and Trademark Office*